(12) United States Patent
Chujo et al.

(10) Patent No.: US 7,068,691 B2
(45) Date of Patent: Jun. 27, 2006

(54) DIRECTLY MODULATED OPTICAL MODULE AND METHOD FOR DRIVING SEMICONDUCTOR LASER INCLUDED THEREIN

(75) Inventors: Norio Chujo, Tokyo (JP); Osamu Kagaya, Tokyo (JP)

(73) Assignee: OpNext Japan, Inc., Yokohama (JP)

( * ) Notice: Subject to any disclaimer, the term of this patent is extended or adjusted under 35 U.S.C. 154(b) by 80 days.

(21) Appl. No.: 10/642,373

(22) Filed: Aug. 15, 2003

(65) Prior Publication Data
US 2004/0174916 A1 Sep. 9, 2004

(30) Foreign Application Priority Data
Mar. 6, 2003 (JP) ............................. 2003-060223

(51) Int. Cl.
*H01S 3/00* (2006.01)

(52) U.S. Cl. ................................. 372/38.02; 372/38.07

(58) Field of Classification Search ............. 372/38.02, 372/38.07
See application file for complete search history.

(56) References Cited

U.S. PATENT DOCUMENTS 6,597,209 B1 * 7/2003 Iguchi et al. ............... 327/108

FOREIGN PATENT DOCUMENTS

| JP | 01048481 A | * | 2/1989 |
| JP | 11-214781 A | | 8/1999 |
| JP | 2003-017800 A | | 1/2003 |

OTHER PUBLICATIONS

Trapezoid dictionary entry (found using Dictionary.com), The American Heritage Dictionary of the English Language, Fourth Edition, 2000, Houghton Mifflin Company.*

* cited by examiner

*Primary Examiner*—Minsun Ch Harvey
*Assistant Examiner*—Tod T. Van Roy
(74) *Attorney, Agent, or Firm*—Townsend and Townsend and Crew LLP

(57) ABSTRACT

In a directly modulated optical module, the input current to drive the semiconductor laser is controlled so as to make a rate of change in fall time smaller than a rate of change in rise time (inclination) in order to improve the eye opening of an eye pattern and extend the transmission distance. In addition, the input current is overshot at least during the period of transient state following the rising edge.

8 Claims, 11 Drawing Sheets

DIRECTLY MODULATED OPTICAL MODULE AND METHOD FOR DRIVING SEMICONDUCTOR LASER INCLUDED THEREIN

BACKGROUND OF THE INVENTION

The present invention relates to a directly modulated optical module. FIG. 10 shows an exemplary configuration of a conventional directly modulated optical module. In FIG. 10, 1' is a directly modulated optical module, 2' is a semiconductor laser, 3' is a driver circuit which drives the semiconductor laser 2' with a current changed based on a transmission signal, 4' is a lens which converges the laser light emitted from the semiconductor laser 2', 5' is an optical fiber which transmits the laser light and 7' is a bias circuit allowing a bias current to flow into the semiconductor laser 2'.

In this configuration with the bias current provided by the bias circuit 7', the driver circuit 3' drives the semiconductor laser 2' which in turn generates laser light depending on the current (hereinafter denoted as the input current as the case may be) entered from the driver circuit 3'. This laser light is converged by the lens 4' and then goes into the optical fiber 5' as an optical signal for transmitting information. FIG. 11(a) shows an example of the waveform of the aforementioned input current 20. FIG. 11(b) shows an example of the waveform of the optical output (laser light output) 21 emitted from the semiconductor laser 2'. FIG. 11(c) shows an example of the eye pattern waveform formed by superimposing the optical output at intervals of one bit data period through a filter determined according to an optical waveform evaluation standard for optical transmission equipment. In the prior art, as shown, the driver circuit 3' outputs such a trapezoidal waveform that the rise time of the input current 20 is almost same as the fall time, that is, the rate of change in the rise time is almost the same as the rate of change in the fall time (FIG. 11(a)). Since the semiconductor laser 2' has relaxation oscillation when turned on, the waveform of the optical output 21 shows ringing at the rising edge and rises sharper than falls (FIG. 11(b)). If the ringing is large, it may be impossible to remove the ringing even through the filter determined by the optical waveform evaluation standard, leading to a deterioration of the eye opening. Thus, a technique has been devised which adds feed forward circuitry to the driver circuit in order to enlarge the eye opening by suppressing the ringing of the optical output waveform, as disclosed in Japanese Patent Laid-open No. 11-214781.

Further, another method intends to allow the drive current waveform to sharply fall while suppressing the ringing of the optical output waveform at the rising edge as disclosed in Japanese Patent Laid-open No. 2003-17800. Japanese Patent Laid-open No. 2003-17800 is not necessarily prior art to the invention described and claimed herein. That document is discussed herein only as providing information related to this application. In the laid-open document, the driver circuit comprises transistor and resistor combinations which are selectively used in order to supply a pulsed current waveform whose rising edge consists of a predetermined number of appropriate steps In the case of the conventional drive circuit which outputs a drive current whose waveform is designed to rise and fall in the same length of time, making sharper the falling edge of the optical output of the semiconductor laser 2' in order to improve the eye opening results inevitably in making the rising edge sharper too. Making the rising edge sharper enlarges the relaxation oscillation 21b (ringing) at the rising edge, which makes the eye opening of the eye pattern waveform smaller and the transmission distance shorter.

Conversely, making the rise time of the input 20 longer, i.e., making the rising edge more gradual (lowering the rate of change in the rise time), makes the fall time 21d of the optical output waveform longer and the falling edge more gradual although the ringing at the rising edge is reduced. This may cause interference with the adjacent data, which makes it impossible to realize a required transmission rate, for example, 10 G bps.

In addition, the ringing at the rising edge is dependent on the amount of rising (amplitude) as well as the rising sharpness (the rate of change in the rise time). This means that the ringing can also be decreased by dividing the rising edge into a predetermined number of steps of small amplitudes and imposing a settlement period after each rising step as described in the above-cited Japanese Patent Laid-open No. 2003-17800. The ringing due to the last rising step can be suppressed by this method.

In this method described in the above-cited Japanese Patent Laid-open No. 2003-17800, however, since each rising step of the input current is a rectangular waveform having a sharp rising edge, the respective steps cause ringing which is superimposed at the rising edge of the waveform of the optical output, resulting in deteriorating the eye opening. If the rising edge is divided more finely so as not to deteriorate the eye opening, it is inevitable to not only enlarge the scale of the driver circuit but also control the driver circuit at an unrealistic speed. For example, for 10 G bps transmission, since the rise time must be set to 20 to 30 ps, dividing the rise time into several steps makes it necessary to control the circuit within 10 ps.

In addition, the methods disclosed in Japanese Paten Laid-open No. 11-214781 and Japanese Patent Laid-open No. 2003-17800 have a common problem which also deteriorates the eye opening as described below.

Following a transient period (a portion 21b of the waveform) in which the optical intensity falls due to a ringing caused by the relaxation oscillation, the optical output waveform of the semiconductor laser 2' rises gradually to the peak. In the prior art, this factor also causes the eye opening to deteriorate.

This invention extends the transmission distance of a directly modulated optical module by enlarging the eye opening. In particular, the present invention is intended to extend the transmission distance of an optical transmission module for 10 Gbps or higher rate transmission.

SUMMARY OF THE INVENTION

A directly modulated optical module uses a driver IC characterized in that the drive current output from the driver IC to a semiconductor laser has a trapezoidal waveform in which a rate of change in the fall time is greater than a rate of change in the rise time. By providing such a trapezoidal waveform of current to the semiconductor laser, it is possible to make ringing smaller and a transmission distance longer.

A directly modulated optical module uses a driver IC characterized in that the drive current output from the driver IC to a semiconductor laser has a waveform which overshoots at the rising edge. By providing such the waveform of current which rises beyond the steady state level in the ringing transient period following the rising edge so as to raise the optical output in this transient period, it is possible to enlarge the eye opening and therefore extend the transmission distance.

Preferably, in the above-mentioned driver circuits, the rate of change in the rise time and the rate of change in the fall time satisfy the relation of "rise time"/"fall time" □ 1.3.

DETAILED DESCRIPTION OF THE PREFERRED EMBODIMENT

The following describes embodiments of the present invention with reference to the drawings.

Figure 1:
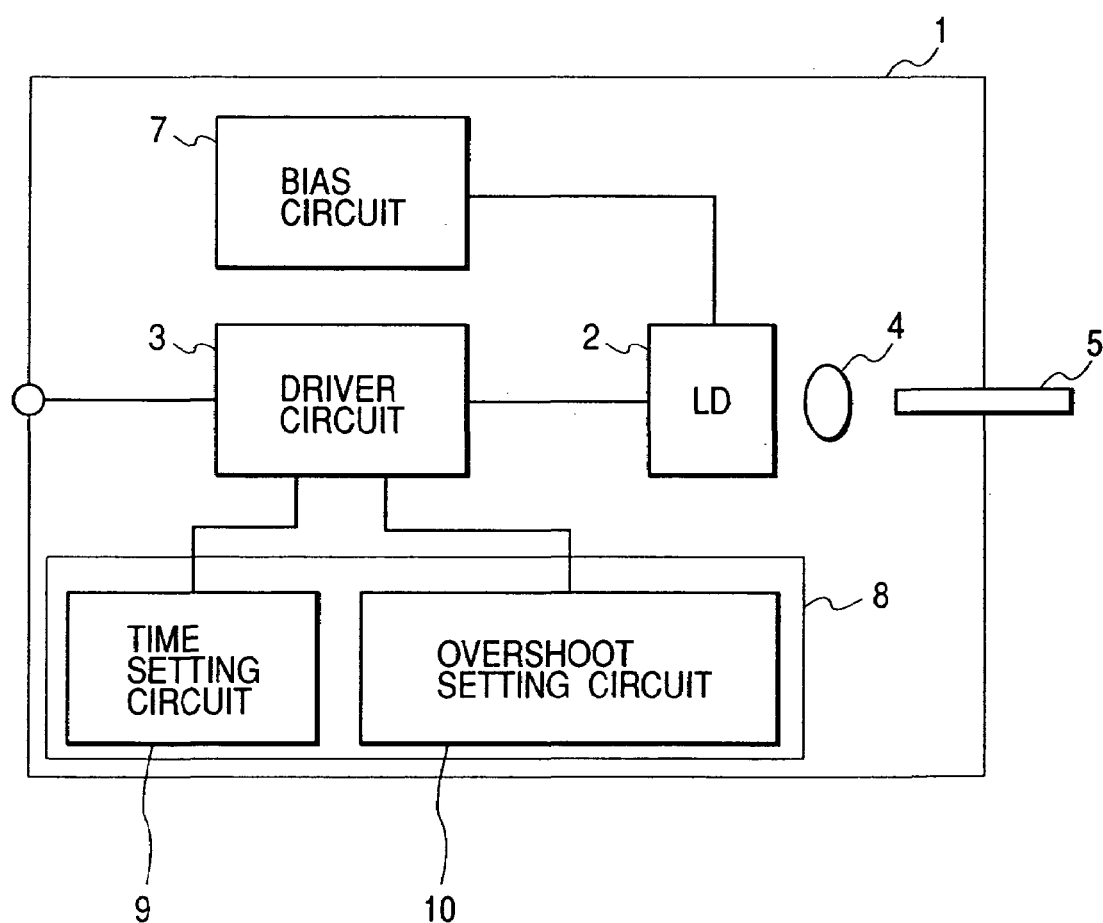
FIG. 1 is a conceptual diagram of a directly modulated optical module according to a first embodiment.

FIG. 1 is a conceptual diagram of an optical module. In FIG. 1, reference numeral 1 is a directly modulated optical module, 2 is a semiconductor laser which outputs laser light modulated depending on the input current, and 3 is a driver circuit as a drive current output means for forming and outputting a supply current to the semiconductor laser 2. Reference numeral 4 is a lens to converge the light emitted from the semiconductor laser 2, and 5 is an optical fiber which transmits laser light. Reference numeral 7 is a bias circuit which allows a bias current to flow through the semiconductor laser 2, and 8 is a control circuit as a control means which acts on the drive circuit 3 to control the characteristics of the input current. Reference numeral 9 is a time setting circuit which in the control circuit 8, sets a rate of change in rise time and a rate of change in fall time according to rise time and fall time, respectively. Lastly, reference numeral 10 is an overshoot setting circuit which also in the control circuit 8, sets the overshoot characteristic (increase in the amplitude of the input current) of the input current at the rising edge. The driver circuit 3, bias circuit 7 and control circuit 8 constitutes a laser control and drive circuit.

With the bias current supplied from the bias circuit 7, the semiconductor laser 2 is driven by the input current supplied from the driver circuit 3 and outputs laser light which is modulated depending on the input current.

Figure 11A:
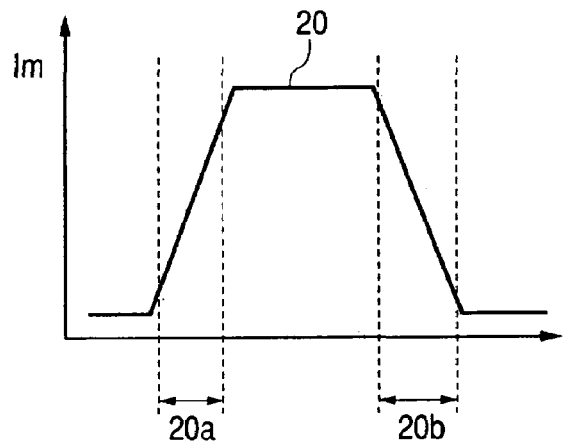
FIGS. 11(a), 11(b) and 11(c) show the respective examples of operating waveforms in a conventional directly modulated optical module.
Figure 11B:
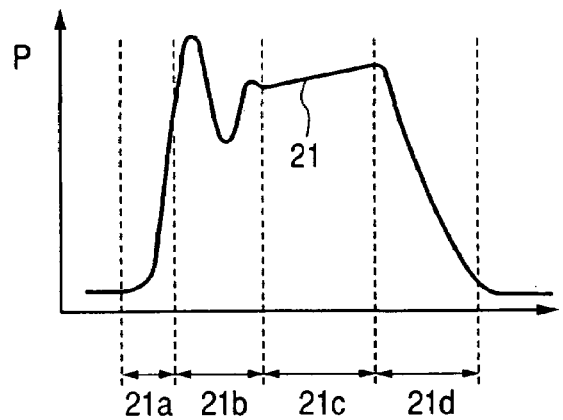
Figure 11C:
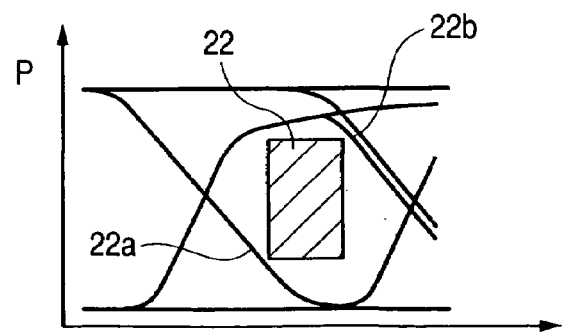

Note that it is assumed that the semiconductor laser used in this embodiment exhibits the same response as shown in FIG. 11(b) if the waveform of the input current has almost no difference between its rates of changes in rise time and fall time (this means "the rate of change in rise time"/"the rate of change in fall time" is not greater than 1.0 ideally or not greater than 1.1 if fluctuations of the signal characteristics and so on are taken into consideration), that is, the optical power has relaxation oscillation 21b at the time of rising and then rises gradually to a certain level (21c), the optical power rises faster than falls due to the relaxation oscillation 21b, and making the rise time of the input current shorter enlarges the relaxation oscillation 21b.

The driver circuit 3 forms the input current modulated under control of a transmission signal. Further, the driver circuit 3 is controlled by the control circuit 8 so as to set the respective rates of changes in the rise time and fall time of the input current according to the respective rising and fall time. The time setting circuit 9 in the control circuit 8 sets the rise time and fall time of the input current in such a manner that the fall time is shorter than the rise time, that is, the rate of change in fall time is larger than that in rise time.

In addition, the overshoot setting circuit 10 in the control circuit 8 sets the characteristics of the input current so as to have an overshoot at the rising edge, that is, so as to rise beyond the peak value at least during the period of the transient state. It is possible to keep this setting effective during the 1 bit data period until the falling is complete.

By setting the rate of change in the fall time of the input current larger than that in the rise time as mentioned above, it is possible to prevent the eye opening from deteriorating due to lack of the rate of change in the fall time, which improves the eye opening and therefore extends the transmission length.

In addition, by setting the input current so as to have an overshoot, it is possible to improve the eye opening and therefore extends the transmission length.

Note that in other words, improving the eye opening is to increase the margin to the mask specification for the eye pattern waveform.

The laser light emitted from the semiconductor laser 2 is converged by the lens 4 for incidence into the optical fiber 5 as an optical signal for transmitting information.

Figure 2A:
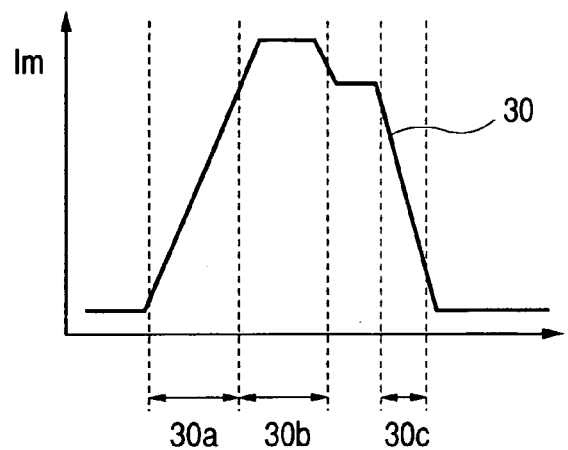
FIGS. 2(a), 2(b) and 2(c) are respective exemplary diagrams showing the respective waveforms of an input current to a semiconductor laser in the directly modulated optical module of FIG. 1, an optical output of the same semiconductor laser and an eye pattern of the same semiconductor laser.
Figure 2B:
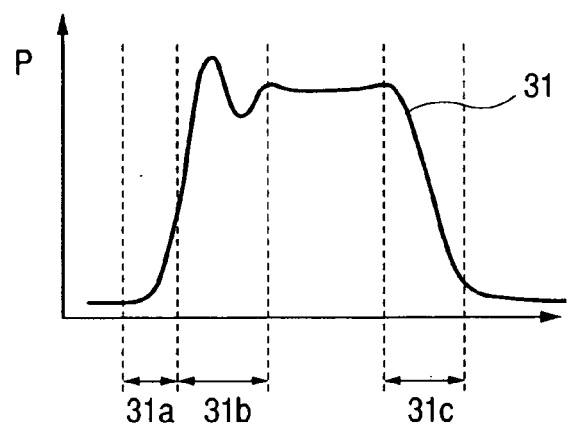
Figure 2C:
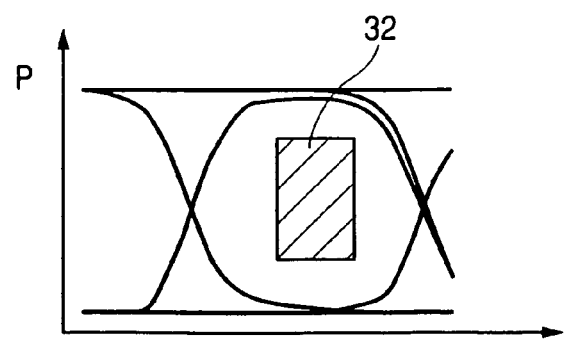

FIG. 2(a) shows an example of the waveform of the input current which is output from the driver circuit 3 of FIG. 1. FIG. 2(b) shows an example of the waveform of the optical output (laser light output) emitted from the semiconductor laser 2 of FIG. 1. FIG. 2(c) shows an example of the eye pattern waveform formed by superimposing the optical output at intervals of one bit data period through a filter.

In FIG. 2, 30 is the waveform of the input current, 30a, 30b and 30c are the rise time, overshoot time and fall time of the input current, respectively. Reference numeral 31 is the waveform of the optical output, 31a, 31b and 31c are the rise time, relaxation oscillation time (ringing transient period) and fall time of the optical output, respectively, and 32 is a mask specification for the eye pattern waveform.

In the input current waveform 30, the fall time 30c is set so as to make the fall time 31c of the optical output waveform 31 short enough while the rise time 30a is set so as to make the relaxation oscillation time 31b of the optical output waveform 31 not influential on the eye pattern waveform. Accordingly, the fall time 30c and rise time 30a are set in such a manner that the fall time 30c is shorter than the rise time 30a and "the rate of change in fall time"/"the rate of change in rise time" becomes equal to or greater than 1.3. The overshoot of the input current waveform 30 may be set so as to make the average voltage of the optical output waveform 31 during the relaxation oscillation time 31b almost equal to the amplitude. For example, a 10 G bps directly modulated optical module could conceivably be configured by setting "fall time"/"rise time" in the definition of 20 to 80% to "rise time" $\geqq 15\times 10^{-12}$ s and ("fall time"– "rise time")$\geqq 14\times 10^{-12}$ s and by setting the overshoot of the input current waveform 30 so as to make the average voltage of the optical output waveform 30 during the relaxation oscillation time 31b almost equal to the amplitude.

Figure 3:
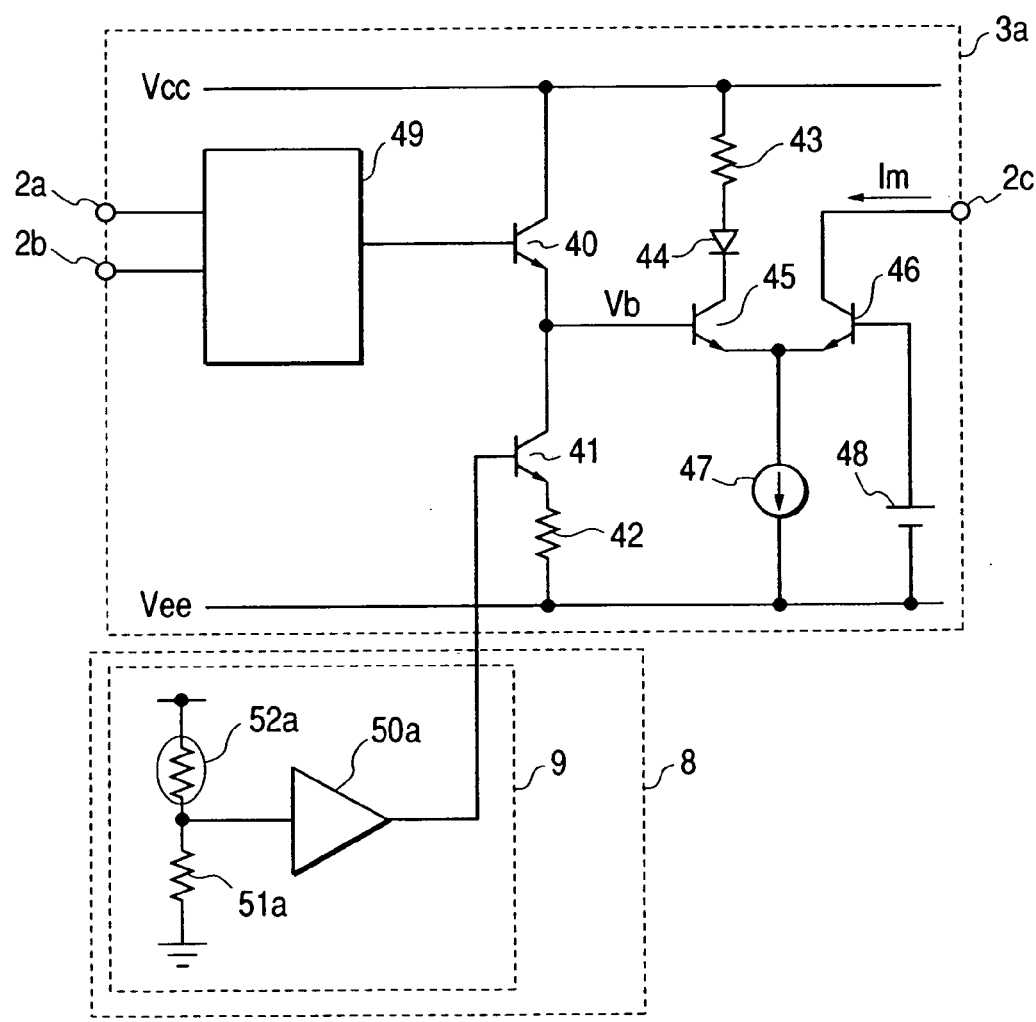
FIG. 3 shows the configuration of a driver circuit combined with a control circuit capable of adjusting the rise time of the input current in accordance with a second embodiment.
Figure 4A:
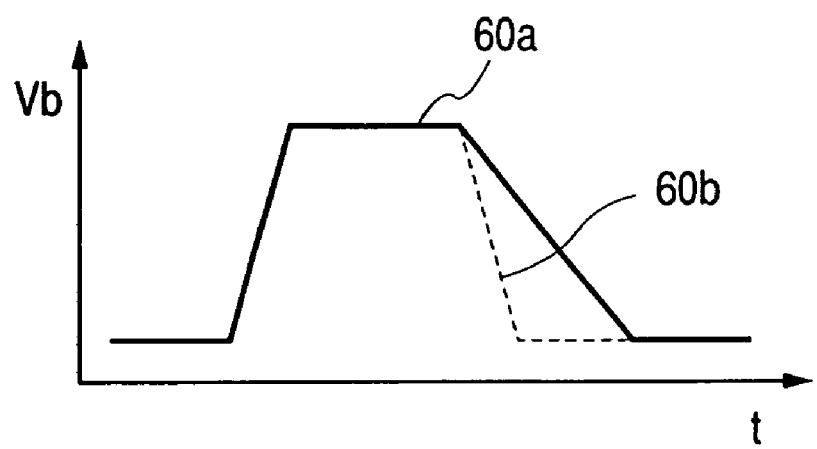
FIGS. 4(a) and 4(b) show the respective examples of operating waveforms in the configuration of FIG. 3.
Figure 4B:
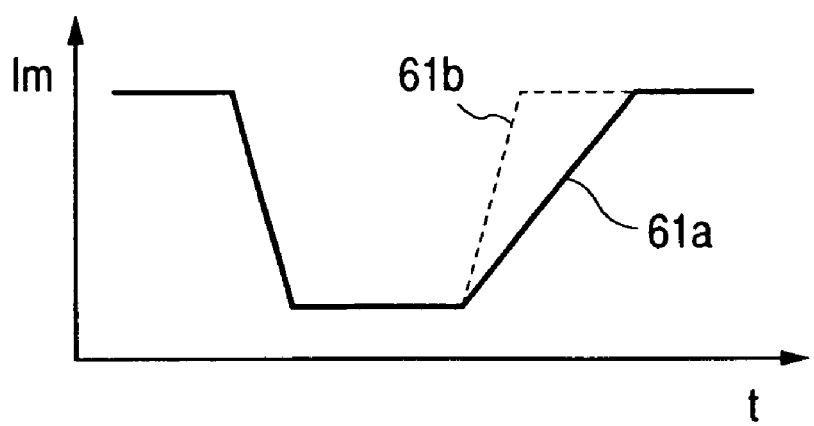

FIG. 3 shows a control circuit and a driver circuit, according to a second embodiment, which are configured so as to allow the rise time of the input current to be adjusted. FIG. 4 shows its operation waveforms.

In FIG. 3, 3a is a driver circuit, 2a is a data signal input terminal, and 2b is an opposite phase data signal input terminal. Reference numeral 49 is a waveform shaping circuit to shape the input waveform, 45 and 46 are transistors which generate and outputs the output current (=input current to the semiconductor laser) of the driver, and 47 is a constant current source. Reference numeral 40 is an emitter follower circuit, 41 is a transistor allowing a bias current in the emitter follower circuit 40 to flow, and 44 is a diode. Reference numeral 48 is a constant voltage source, 8 is a control circuit, 9 is a time setting circuit, 50a is a buffer, and 52a is a thermistor. The driver circuit 3a and control circuit 8 constitutes a laser control and drive circuit. The transistors 45, 46 and constant current source 47 constitutes a differential amplifier circuit. This differential amplifier circuit is driven by the emitter follower circuit 40. The transistor 41 and resistor 42 also forms a constant current source. The constant voltage source 48 gives a voltage to the base of the transistor 46 of the differential amplifier circuit. The diode 44 and resistor 43 are connected to the collector of the transistor 45 of the differential amplifier circuit in order to simulate the semiconductor laser and dumping resistor respectively. In the time setting circuit 9, a voltage obtained by voltage division using the resistor 51a an thermistor 52a is converted to an appropriate voltage by the buffer 50a.

In the emitter follower circuit 40, while the rise time is determined by the emitter resistance of the emitter follower 40 and the parasitic capacitance and mirror capacitance which are coupled with the base of the transistor 45, the fall time is determined by the current of the constant current source consisting of the transistor 41 and resistor 42. Therefore, it is possible to lengthen the fall time in the emitter follower circuit 40 without changing the rise time if the base voltage of the transistor 41 is lowered by the time setting circuit 9 to reduce the current of the constant current source. That is, it is possible to lengthen only the fall time of the base voltage Vb of the output transistor 45 of the differential amplifier circuit (as shown by a solid line 60a in FIG. 4(a)). Lengthening the fall time of the base voltage Vb of the transistor 45 makes longer the rise time of the input current Im which is output from the driver circuit 3a to the semiconductor laser (as shown by a solid line 61a in FIG. 4(c)) and therefore makes longer the rise time of the optical output waveform of the semiconductor laser. In the time setting circuit 9, the voltage obtained by voltage division between the resistor 51a and thermistor 52a is input to the buffer 50a. Therefore, as the temperature of the module falls due to changes in the ambient temperature and the like, the base voltage of the transistor 41 goes lower to lengthen the rise time of the output current (=input current to the semiconductor laser) of the driver circuit 3a, namely, make the rate of change in the rise time slower.

Note that although the thermistor 52 is used to provide a temperature characteristic in the configuration of the time setting circuit 9, another device may alternatively be used. In addition, if no temperature characteristic is needed, the time setting circuit 9 may be configured by a constant current source, ordinary resistive divider or the like. As for the driver circuit 3a, the waveform shaping circuit 49 may be modified so as to receive only one of the data signals 2a and 2b. It is also possible to add, for example, a latch circuit and clock input terminal to the waveform shaping circuit 49 so as to perform re-timing of the waveform. The diodes 44 and resistor 43 may be omitted from the configuration. In addition, the transistors must not be bipolar transistors. For example, MOS transistors may be used alternatively.

Figure 5:
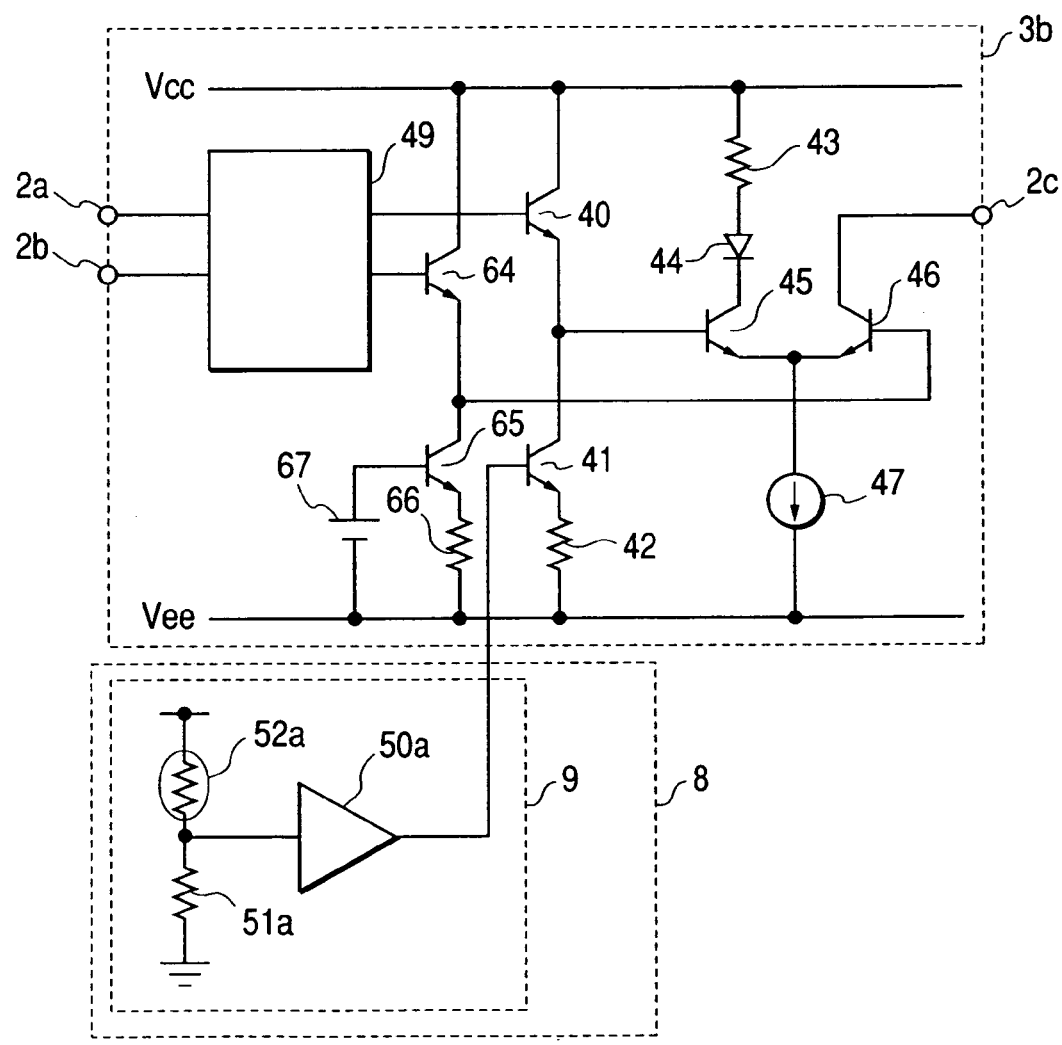
FIG. 5 shows the configuration of a driver circuit combined with a control circuit capable of adjusting the rise time of the input current in accordance with a third embodiment.

FIG. 5 shows a control circuit and a driver circuit, according to a third embodiment, which are configured so as to allow the rise time of the input current to be adjusted. In the third embodiment of configuration, the base of each of the transistors forming a differential amplifier circuit is connected to an emitter follower circuit and a constant current source which allows a current to flow in the emitter follower circuit. FIG. 4 shows its operation waveforms.

In FIG. 5, 3b is a driver circuit, 64 is an emitter follower circuit, 67 is a constant voltage source and 65 is a transistor which forms a constant current source with a resistor 66 and a constant voltage source 67. The driver circuit 3b and the control circuit 8 constitutes a laser control and drive circuit. The other elements are identical to those in FIG. 3. The signal used as the input to the emitter follower 64 is phase-opposite to the input to the emitter follower circuit 40 in FIG. 3. The resistor 66 and constant voltage source 67 are adjusted so as to make the rise time and fall time of the emitter follower circuit 64 approximately equal to each other.

In the third embodiment, since a signal is applied to the transistor 46 of the differential amplifier circuit, it is possible to shorten both the rise time and fall time.

Figure 6:
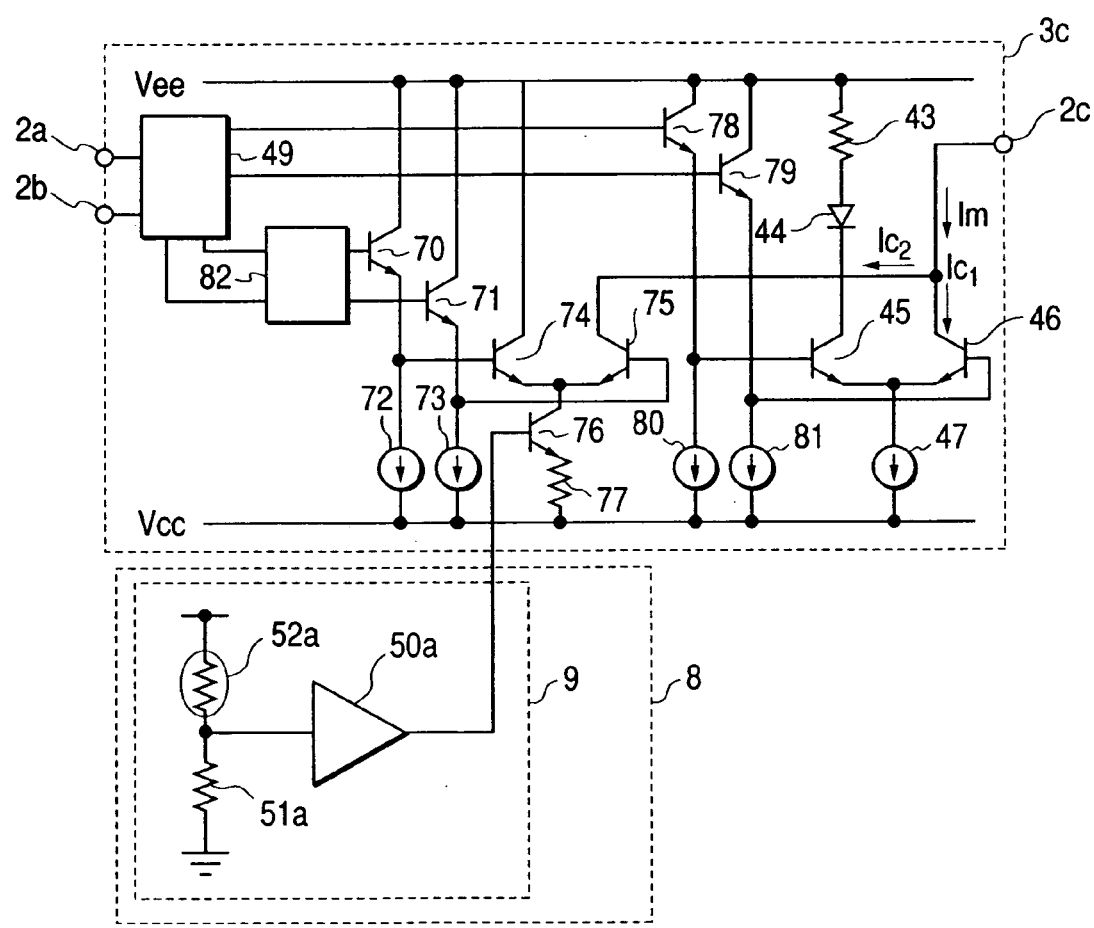
FIG. 6 shows the configuration of a driver circuit combined with a control circuit capable of adjusting the rise time of the input current in accordance with a fourth embodiment.

FIG. 6 shows a driver circuit and a control circuit configured so as to allow a rate of change in the rise time of an input current to be adjusted in accordance with a fourth embodiment. FIG. 7 shows its operation waveforms. The fourth embodiment uses two differential amplifier circuits.

Figure 7A:
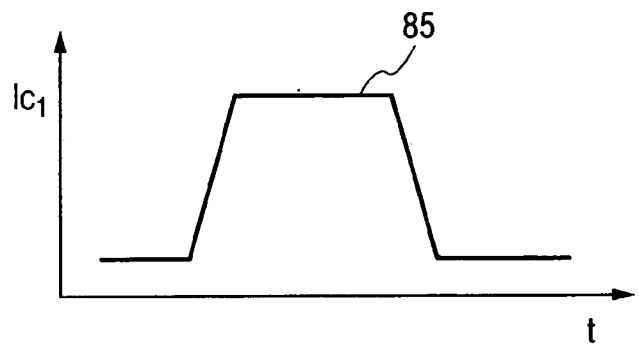
FIGS. 7(a), 7(b) and 7(c) show the respective examples of operating waveforms in the configuration of FIG. 6.
Figure 7B:
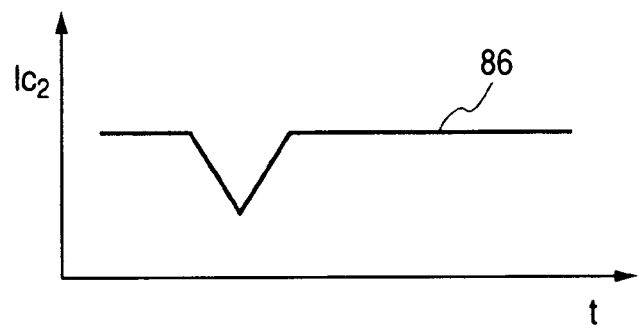
Figure 7C:
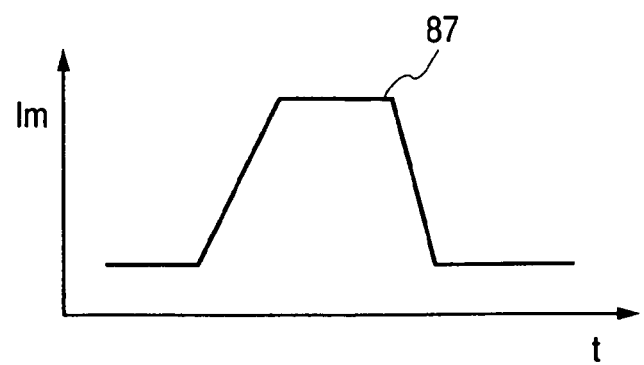

In FIG. 6, 3c is a driver circuit, 70, 71, 78 and 79 are emitter follower circuits, 82 is a differentiating circuit, 74, 75 and 76 are transistors which form a second differential amplifier circuit, and 72, 73, 80 and 81 are constant current sources. The driver circuit 3c and control circuit 8 constitutes a laser control and drive circuit. The other elements are identical to those in FIG. 3. The differentiating circuit 82 detects a rising edge from the output of the waveform shaping circuit 49 and generates its differentiated waveform. The emitter follower circuits 78 and 79 drive a first differential amplifier circuit comprising the transistors 45 and 46, and the emitter follower circuits 70 and 71 drive the second differential amplifier circuit comprising the transistors 74 and 75. The collector of the transistor 46 of the first differential amplifier circuit and the collector of the transistor 75 of the second differential amplifier circuit are connected with each other. FIG. 7(a) shows the waveform of the collector current 85 in the transistor 46 of the first differential amplifier circuit, FIG. 7(b) shows the waveform of the collector current 86 in the transistor 75 in the second differential amplifier circuit and FIG. 7(c) is the waveform of the current 87 output from the driver circuit 3c (input current supplied to the semiconductor laser). Since the current 87 is the sum of the collector current 85 and collector current 86, only the rise time is lengthened. In addition, since the amplitude of the collector current 86 in the transistor 75 is determined by the base voltage of the transistor 76 of the constant current source for the second differential amplifier circuit, it is possible to adjust the rate of change in the rise time by applying the output of the time setting circuit 9 to the base of the transistor 76.

Figure 8:
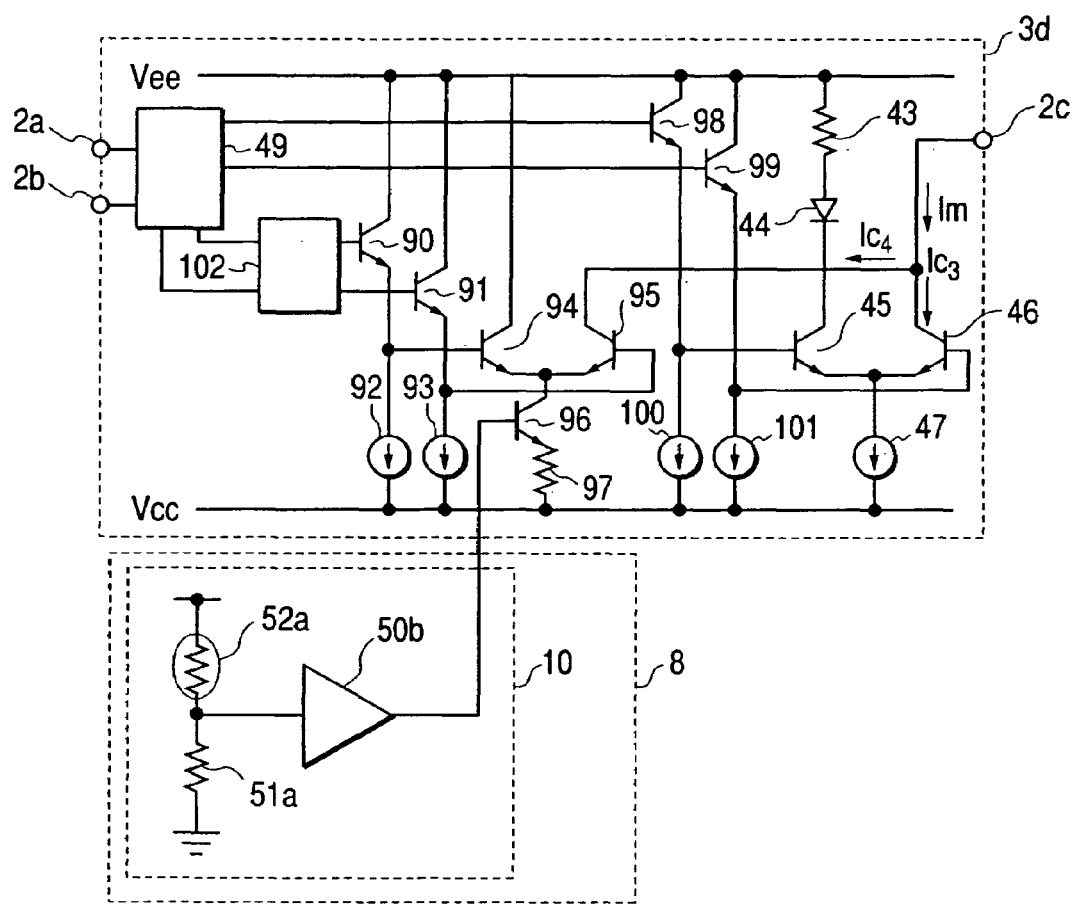
FIG. 8 shows the configuration of a driver circuit combined with a control circuit capable of adjusting the overshoot of the input current in accordance with a fifth embodiment.
Figure 9A:
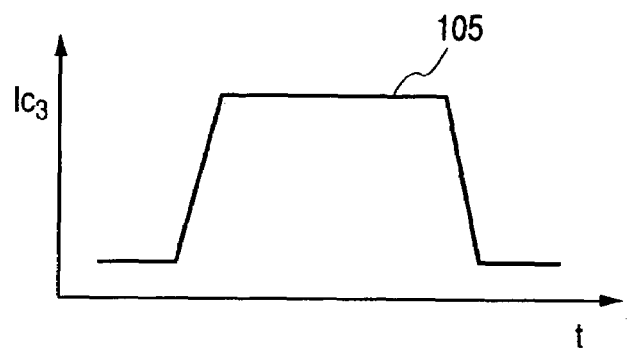
FIGS. 9(a), 9(b) and 9(c) show the respective examples of operating waveforms in the configuration of FIG. 8.
Figure 9B:
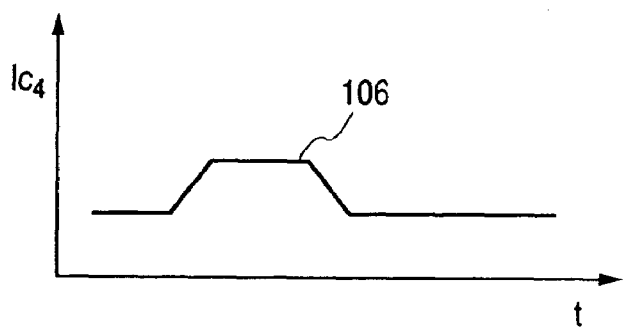
Figure 9C:
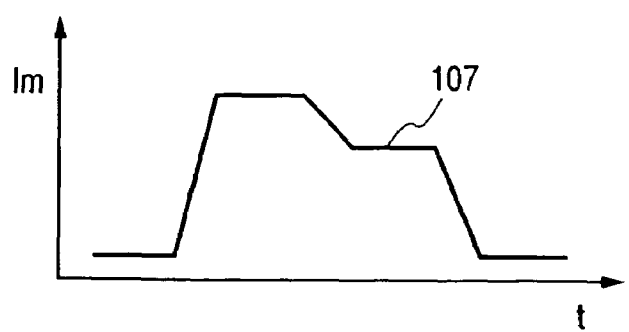
Figure 10:
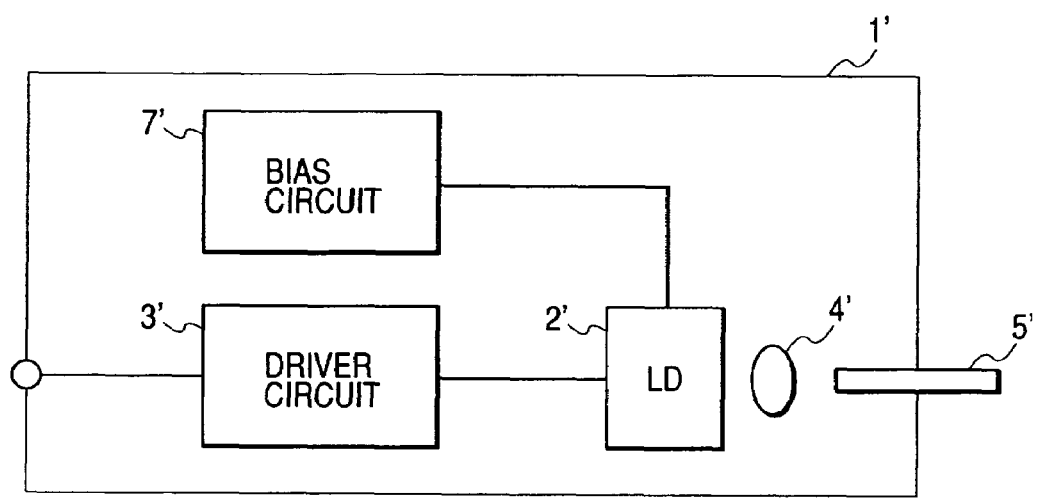
FIG. 10 shows an example of the configuration of a conventional directly modulated optical module.

FIG. 8 shows a control circuit and a driver circuit configured so as to allow adjustment of the overshoot characteristic of the input current at the rising edge in accordance with a fifth embodiment. FIG. 9 shows its operation waveforms. This embodiment uses two differential amplifier circuits.

In FIG. 8, 3*d* is a driver circuit, 90, 91, 98 and 99 are emitter follower circuits, 102 is a pulse generation circuit, 94, 95 and 96 are transistors which forms a second differential amplifier circuit, 92, 93, 100 and 101 are constant current sources and 10 is an overshoot setting circuit. The driver circuit 3*d* and control circuit 8 constitute a laser control and drive circuit. The other elements are identical to those in FIG. 3. The pulse circuit 102 detects a rising edge from the output of the waveform shaping circuit 49 and generates a pulse having a predetermined width. This pulse width is determined so as to match the rising waveform of the semiconductor laser by gradually increasing the amplitude by use of the internal delay circuit of the pulse generation circuit 102. By inputting a clock signal to the driver circuit 3*d*, this pulse may also be formed in such a manner that the pulse width is made equal to one to several cycles of the clock. The emitter follower circuits 98 and 99 drive a first differential amplifier circuit comprising the transistors 45 and 46 and the emitter follower circuits 90 and 91 drive the second differential amplifier circuit comprising the transistors 94 and 95. The collector of the transistor 46 of the first differential amplifier circuit and the collector of the transistor 95 of the second differential amplifier circuit are connected with each other. In the overshoot setting circuit 10, a voltage obtained by voltage division between the resistor 51*b* and thermistor 52*b* is converted by a buffer 50*b* to an appropriate voltage. FIG. 9(*a*) shows the waveform of the collector current 105 in the transistor 46 of the first differential amplifier circuit, FIG. 9(*b*) shows the waveform of the collector current 106 in the transistor 95 in the second differential amplifier circuit and FIG. 9(*c*) is the waveform of the current 107 output from the driver circuit 3*d* (input current supplied to the semiconductor laser). Since the current 107 is the sum of the collector current 105 and collector current 106, an overshoot characteristic is added to the rising edge. In addition, since the amplitude of the collector current 106 in the transistor 75 is determined by the base voltage of the transistor 96 of the constant current source for the second differential amplifier circuit, it is possible to adjust the overshoot by applying the output of the overshoot setting circuit 10 to the base of the transistor 96.

Note that although the embodiments of FIGS. 3 through 7 are configured so as to control the rate of change in the rise time, the present invention is not limited to these configurations. These embodiments can be modified so as to control either the fall time or both the rise time and fall time. In addition, although the embodiment of FIGS. 8 and 9 is configured so as to control only the rising overshoot, this embodiment can be modified so as to control not only the rising overshoot but also the rise time and/or fall time. Further, the control circuit 8, driver circuit and bias circuit 7 may all be combined and configured as a single circuit. It is also possible to combine any two of them and configure the combination and the remaining one as separate circuits. Likewise, they may be combined and configured either as a single IC (Integrated Circuit) chip or separate IC chips. It is also possible to configure each of them as a single IC chip.

According to the present invention, it is possible to extend the transmission distance of a directly modulated optical module since the directly modulated optical module can improve the eye opening of its optical output waveform.

The present invention can be implemented by other embodiments differing from the aforementioned embodiments without departing from the spirit and major features of the present invention. Thus, in every respect, the aforementioned embodiments are merely examples of implementing the present invention and should not limit the present invention to the particular forms. The scope of the present invention is clarified by the appended claims. Further, the present invention is to cover all modifications and changes falling within the range of any equivalent to the claims.

What is claimed is:

1. A directly modulated optical module wherein optical output intensity of a semiconductor laser is modulated by changing a current allowed to flow into the semiconductor laser depending on a transmission signal, the optical module comprising:
   a driver circuit providing the current with a trapezoidal waveform to the semiconductor laser;
   wherein the trapezoidal waveform is characterized in that a rate of change in fall time of the current is greater than a rate of change in rise time of the current; and
   the driver circuit is controlled so that a ratio of the rate of change in fall time divided by the rate of change in rise time is at least 1.3.

2. A directly modulated optical module wherein optical output intensity of a semiconductor laser is modulated by changing a drive current allowed to flow into the semiconductor laser depending on a transmission signal, the optical module comprising:
   a driver circuit providing the drive current which overshoots during a transient period associated with a rising edge of the drive current; and
   a overshoot setting circuit generating a control voltage supplied to the driver circuit which is obtained by voltage division between a resistor and a thermistor provided in the overshoot setting circuit; and
   wherein the driver circuit comprises:
      a first current circuit generating a first current having a trapezoidal waveform under control of the transmission signal provided to the driver circuit;
      a second current circuit generating a second current added to the first current to provide the drive current in the driver circuit; and
      a control circuit detecting the rising edge of the drive current from the transmission signal, and controlling the second current circuit in accordance with the rising edge of the drive current; and wherein overshoot of the drive current is controlled by setting a value of the second current with respect to an average voltage of an optical output waveform in the second current circuit, and by limiting a period to add the second current to the first current within the transient period by controlling the second current circuit by the control voltage outputted from the overshoot setting circuit; and a waveform of the drive current is shaped by the first current and the second current during the transient period, and otherwise by the first current.

3. An optical module according to claim 2 wherein the control circuit generates a pulse having a width to match the rising waveform of the semiconductor laser and controls the second current circuit in accordance with the pulse.

4. An optical module according to claim 2 wherein the overshoot setting circuit includes a buffer for converting the control voltage to an appropriate voltage.

5. A directly modulated optical module wherein optical output intensity of a semiconductor laser is modulated by changing a current allowed to flow into the semiconductor laser depending on a transmission signal, the optical module comprising:
  a driver circuit which, if no control signal is received, provides a current having a trapezoidal waveform corresponding to the transmission signal, wherein the trapezoidal waveform is characterized by having a fall time of the current at least as long as a rise time of the current; and
  control means which outputs the control signal to the driver circuit, wherein the control signal controls the driver circuit to make the fall time of the output current shorter than the rise time of the output current, so that a ratio of a rate of change in the fall time to a rate of change in the rise time is at least 1.3.

6. A directly modulated optical module according to claim 5 wherein the control means is configured by a voltage division circuit having a resistor and a thermistor, and the rate of change in the rise time is reduced in accordance with a voltage obtained by voltage division between the resistor and the thermistor.

7. A directly modulated optical module according to claim 6, wherein:
  the first current circuit is configured as a first differential amplifier circuit comprising first transistors driven by first emitter follower circuits, each of the first transistors and the first emitter follower circuits being controlled in accordance with the transmission signal provided to the driver circuit, and
  the second current circuit is configured as a second differential amplifier circuit comprising second transistors driven by second emitter follower circuits, each of the second transistors and the second emitter follower circuits being controlled in accordance with the pulse generated by the control circuit.

8. A directly modulated optical module according to claim 7, wherein the second current circuit comprises a control transistor limiting the period to add the second current to the first current within the transient period with response to the control voltage provided from the overshoot setting circuit.

* * * * *